(12) United States Patent
Fang (10) Patent No.: US 12,302,951 B2
(45) Date of Patent: May 20, 2025

(54) DISPENSING DEVICE WITH AN ELECTROMECHANICAL FEEDBACK SYSTEM AND METHODS OF USE

(71) Applicant: Airo Brands Inc., Staten Island, NY (US)

(72) Inventor: Liming Fang, Seattle, WA (US)

(73) Assignee: Airo Brands Inc., Staten Island, NY (US)

( * ) Notice: Subject to any disclaimer, the term of this patent is extended or adjusted under 35 U.S.C. 154(b) by 0 days.

(21) Appl. No.: 18/757,881

(22) Filed: Jun. 28, 2024

(65) Prior Publication Data

US 2025/0009043 A1 Jan. 9, 2025

Related U.S. Application Data (60) Provisional application No. 63/512,461, filed on Jul. 7, 2023.

(51) Int. Cl.
*A24F 40/60* (2020.01)
*A24F 40/51* (2020.01)
*A24F 40/53* (2020.01)
*H03K 17/687* (2006.01)

(52) U.S. Cl.
CPC .............. *A24F 40/60* (2020.01); *A24F 40/51* (2020.01); *A24F 40/53* (2020.01); *H03K 17/687* (2013.01)

(58) Field of Classification Search
None
See application file for complete search history.

(56) References Cited

U.S. PATENT DOCUMENTS

| | | | |
|---|---|---|---|
| 9,814,271 B2 | 11/2017 | Goggin et al. | |
| 9,913,497 B2 | 3/2018 | Galloway et al. | |
| 10,231,485 B2 | 3/2019 | Sur | |
| 10,470,499 B2 | 11/2019 | Clemens et al. | |
| 10,568,359 B2 | 2/2020 | Henry, Jr. | |
| 10,687,559 B2 | 6/2020 | Memari et al. | |
| 10,750,788 B2 | 8/2020 | Scatterday | |
| 11,013,269 B2 | 5/2021 | Alarcon et al. | |
| 11,044,943 B2 | 6/2021 | Scatterday | |
| 11,229,239 B2 | 1/2022 | Galloway et al. | |
| 11,253,006 B2 | 2/2022 | Memari et al. | |
| 11,259,569 B2 | 3/2022 | Hejazi | |
| 11,278,060 B1 * | 3/2022 | Aradachi | H02J 7/00714 |

(Continued)

FOREIGN PATENT DOCUMENTS

EP 3711552 A1 9/2020
WO 2020234059 11/2020

(Continued)

OTHER PUBLICATIONS

WIPO/ISA/US, International Search Report and Written Opinion issued on Sep. 20, 2024 in corresponding application PCT/US2024/036018, 8 pages.

(Continued)

*Primary Examiner* — Kenneth B Wells
(74) *Attorney, Agent, or Firm* — J. Peter Paredes; Amin Wasserman Gurnani LLP (57) ABSTRACT

Provided herein are systems and apparatuses for a dispensing device with an electromechanical feedback system including safety features and short circuit protection for the electrical cigarette by additional circuitry.

20 Claims, 8 Drawing Sheets

(56) References Cited

U.S. PATENT DOCUMENTS

| | | | |
|---|---|---|---|
| 11,337,461 B2* | 5/2022 | Aradachi | A24F 40/51 |
| 11,406,139 B2 | 8/2022 | Alarcon et al. | |
| 12,016,400 B2 | 6/2024 | Hoffmann et al. | |
| 2009/0283103 A1 | 11/2009 | Nielsen et al. | |
| 2014/0270727 A1 | 9/2014 | Ampolini et al. | |
| 2016/0338407 A1 | 11/2016 | Kerdemelidis | |
| 2016/0345628 A1 | 12/2016 | Sabet | |
| 2017/0119052 A1 | 5/2017 | Williams et al. | |
| 2019/0021400 A1 | 1/2019 | Fornarelli | |
| 2019/0090541 A1 | 3/2019 | Bernauer | |
| 2019/0223510 A1 | 7/2019 | Bowen et al. | |
| 2019/0247606 A1 | 8/2019 | Williams | |
| 2019/0269175 A1 | 9/2019 | Bache et al. | |
| 2019/0364957 A1 | 12/2019 | Fu et al. | |
| 2019/0364969 A1 | 12/2019 | Fu et al. | |
| 2020/0000143 A1 | 1/2020 | Anderson et al. | |
| 2020/0113242 A1 | 4/2020 | Novak, III et al. | |
| 2020/0120986 A1 | 4/2020 | Sur et al. | |
| 2020/0154779 A1 | 5/2020 | Novak, III et al. | |
| 2021/0046261 A1 | 2/2021 | Barbaric et al. | |
| 2021/0154420 A1 | 5/2021 | Jorgensen et al. | |
| 2021/0259316 A1 | 8/2021 | Kersey et al. | |
| 2021/0282465 A1 | 9/2021 | Cristian | |
| 2021/0321489 A1 | 10/2021 | Fisher, Jr. et al. | |
| 2021/0321669 A1 | 10/2021 | Scatterday | |
| 2021/0401061 A1 | 12/2021 | Davis et al. | |
| 2022/0039467 A1 | 2/2022 | Scatterday | |
| 2022/0071284 A1 | 3/2022 | Selby et al. | |
| 2022/0095692 A1 | 3/2022 | Ferrie et al. | |
| 2022/0104552 A1 | 4/2022 | Galloway et al. | |
| 2022/0110372 A1 | 4/2022 | Bessant et al. | |
| 2022/0142260 A1 | 5/2022 | Wells | |
| 2022/0142261 A1 | 5/2022 | Wells | |
| 2022/0160046 A1 | 5/2022 | Wells | |
| 2022/0175049 A1 | 6/2022 | Memari et al. | |
| 2022/0175050 A1 | 6/2022 | Harden et al. | |
| 2022/0183354 A1 | 6/2022 | Sayed et al. | |
| 2022/0202102 A1 | 6/2022 | Desnerck et al. | |
| 2022/0218925 A1 | 7/2022 | McLaughlin | |
| 2022/0249941 A1 | 8/2022 | Bowen et al. | |
| 2022/0256932 A1 | 8/2022 | Yoon et al. | |
| 2022/0256934 A1 | 8/2022 | Harden et al. | |
| 2022/0304378 A1 | 9/2022 | Aller et al. | |
| 2024/0122269 A1 | 4/2024 | Hoffmann et al. | |

FOREIGN PATENT DOCUMENTS

| | | |
|---|---|---|
| WO | 2021026661 | 2/2021 |
| WO | 2021165643 | 8/2021 |
| WO | 2021176394 A1 | 9/2021 |
| WO | 2021240131 | 12/2021 |
| WO | 2021259948 | 12/2021 |
| WO | 2022058728 | 3/2022 |
| WO | 2022103757 | 5/2022 |

OTHER PUBLICATIONS

Pourchez, J. et al. "Impact of power level and refill liquid composition on the aerosol output and particle size distribution generated by a new-generation e-cigarette device", Aerosol Science and Technology, 52:4, 359-369 (2018).

WIPO/ISA/US, International Search Report and Written Opinion issued corresponding application PCT/US2024/036018 on Sep. 20, 2024, 8 pages.

* cited by examiner

DISPENSING DEVICE WITH AN ELECTROMECHANICAL FEEDBACK SYSTEM AND METHODS OF USE

CROSS-REFERENCE TO RELATED APPLICATION

The present application claims priority to U.S. provisional application Ser. No. 63/512,461, filed Jul. 7, 2023, herein incorporated by reference in its entirety.

BACKGROUND

This invention relates to dispensing devices and their means of communication with the user. Specifically, it refers to an electromechanical feedback system and its modes of operation.

Existing electronic cigarette and vaporizer systems rely on digital control mechanisms in order to modulate user experience feedback. These digital systems utilize software driven signaling to communicate between components and to signal the user. Unfortunately, aberrant or unexpected activation is the primary failure mode that can be introduced by microcontroller to haptic driver to feedback systems, which is due to failure of the encoded software within the driver or within the device it controls, or within the microcontroller and the data inputs it monitors and the outputs it generates. It would be desirable to produce an electromechanical feedback system that simplifies the control, reduces the cost of construction, and eliminates several points of failure. The present invention attempts to solve these problems, as well as others.

SUMMARY OF THE INVENTION

Provided herein are systems and apparatuses for a dispensing device with an electromechanical feedback system. The dispensing device with an electromechanical feedback system comprises a battery operably coupled to a switch and a battery protection device, a electromechanical feedback UI operably coupled to the battery protection, an inhalation detection device, an atomizer controller, and a safety controller, an Event of Cartridge Plugging-In (EoCPI) detection device operably coupled the safety controller and an atomizer, and a short detection device operably coupled to the safety controller and the atomizer, wherein the flow of electrical power is transmitted to the atomizer and the safety controller sends a safety shut off signal to the switch; the EoCPI detection device detects the insertion of a cartridge into the dispensing device, and the short detection device detects if there is a short circuit; the switch comprises two electrically controlled switches with a higher current switch and a lower current switch carrying abilities which allow controlling power delivery to separate circuits; the higher current switch feeds the power to the atomizer for normal usage, and the lower current switch controls the power to the EoCPI and short detection device, wherein the lower current switch extends the battery life, and the EoCPI detection device and the short detection device do not need to be powered continuously.

The higher current switch and the lower current switch are MOSFETs (metal-oxide-semiconductor field-effect transistors). The safety controller waits until an EoCPI detection event occurs due to the insertion of the cartridge; and upon an EoCPI detection event, the safety controller tests for the existence of the short circuit; if a short circuit is detected by the safety controller, the dispensing device is disabled and then an alarm is asserted through the electromechanical feedback UI; if no short circuit is detected by the safety controller, the device is ready for normal use of the dispensing device.

The electromechanical feedback UI includes an LED light and a vibration motor. The switch comprises a first P-channel MOSFET and a second P-channel MOSFET, a NOT gate, and an OR gate; the first P-channel MOSFET is the higher current switch that controls power to the atomizer, and the second P-channel MOSFET is the lower current switch that controls power to the EoCPI and SHORT detection circuitry. The switch includes a first external input and a second external input, the first external input is a power port from the battery, and the second external input is a control signal used to turn the first P-channel MOSFET on when puffing is detected by the inhalation detection device.

The circuitry of the safety controller includes a first internal control signal, a second internal control signal, and a third internal control signal, the first internal control signal, the second internal control signal, and the third internal control signal are fed into the switch; and the first internal control signal is a SHORT_TEST_PULSE signal enabling power to the EoCPI and SHORT detection circuitry, starting the short circuit detection when its level is high; the second control signal is a PUFF_ENABLE signal and the third control signal is a CART_ON_PULSE signal, the PUFF_ENABLE signal and the CART_ON_PULSE signal are control signals that cause the controller to turn on first P-channel MOSFET when the PUFF_ENABLE signal and the CART_ON_PULSE signal are at low levels at the same time.

The circuitry of the short detection device includes a resistor bridge and a Schmitt comparator (U4); wherein the resistor bridge includes R1, R2, Rref, and an equivalent resistance of the atomizer), R1 and R2 include an equal resistance, and Rref is 1.1 Ohm; when the second P-channel MOSFET is on, if the equivalent resistance of the atomizer is less than Rref, then the voltage designated as V1 be higher than V2, and the output SHORT_DETECTED of U4 is a high-level signal, indicating that a short circuit has been detected.

The Rref provides a comparison value for determining if there is a short circuit and is a lower resistance than the total equivalent resistance of the atomizer when the product is not short circuited, and a cartridge is inserted. If the equivalent resistance of the atomizer is less than Rref, that indicates that the circuit is shorted, and the SHORT_DETECTED signal is a high level. The circuitry of the EoCPI detection device includes a voltage divider and a Schmitt comparator (U3); the voltage divider includes R3, R4, R5, C1, and C2; the voltage divider provides reference voltages designated as V3 and V4 that depend on the values chosen for resistors R3, R4, and R5; V3=(R4+R5)/(R3+R4+R5); and V4=(R5)/(R3+R4+R5). When there is no cartridge attached, the negative input of U3 (V2) is a high-level close to the voltage of the incoming Power due to conduction through R6; an output of comparator U3 is a low level; and when there is a cartridge, V2 is a low-level close to 0, and the equivalent resistance of the Atomizer is around 2 to 3 Ohms), and the output of U3 is a high-level. When the output of U3 is high-level when the cartridge is attached and output low-level without cartridge; if a cartridge is plugged in, the output of U3 changes from low-level to high-level; and if the cartridge's presence state does not change, and there is no change in an output of U3.

The circuitry of the safety controller comprises a signal delay line, a combinational logic, and a state memory; wherein the signal delay line includes a first delay stage and a second delay stage; the first delay stage includes Rd1, Cd1, Schmitt comparator U5, the second delay stage includes Rd2, Cd2, Schmitt comparator U6 and a NOT gate U8; a plurality of time constants of the two RC networks (Rd1/Cd1 and Rd2/Cd2) set the time delays of the first and second delay stages of the delay line.

The combinational logic includes NOT gates (U8, U9) and AND gates (U10, U11), wherein the combinational logic produces the signals CART_ON_PULSE, SHORT_TEST_PULSE and CART_ON. The CART_ON_PULSE indicates an EoCPI event by outputting a high-level pulse of around 10 ms. The SHORT_TEST_PULSE is a 10 ms long high-level pulse that is used to turn on the lower-current electrical switch to enable a short circuit detection. The CART_ON is a state signal whose low-level indicates there is a cartridge inserted and whose high-level indicates there is no cartridge. The state memory comprises a flip-flop register (U7) and an input combinational logic (AND gate U12); and the input combinational logic enables the normal use of the device when no short circuit is detected.

The CART_ON_PULSE sets the flip-flop register first upon the EoCPI event, and the PUFF_ENABLE output is a low-level state signal; after the CART_ON_PULSE, the dispensing device performs the short circuit test including the SHORT_TEST_PULSE output a high-level pulse; if there is no short circuit detected, the output of U12 continues to output a low-level, so the state of the flip-flop register does not change; the PUFF_ENABLE signal continues to output a low-level signal, thereby enabling normal device operation; and if there is a short circuit detected, U12 outputs a high-level pulse, changing the state of the flip-flop register; and the PUFF_ENABLE signal is high-level, thereby disabling normal device operation.

The systems and apparatuses are set forth in part in the description which follows, and in part will be obvious from the description, or can be learned by practice of the methods, apparatuses, and systems. The advantages of the systems and apparatuses will be realized and attained by means of the elements and combinations particularly pointed out in the appended claims. It is to be understood that both the foregoing general description and the following detailed description are exemplary and explanatory only and are not restrictive of the systems and apparatuses, as claimed.

Accordingly, it is an object of the invention not to encompass within the invention any previously known product, process of making the product, or method of using the product such that Applicants reserve the right and hereby disclose a disclaimer of any previously known product, process, or method. It is further noted that the invention does not intend to encompass within the scope of the invention any product, process, or making of the product or method of using the product, which does not meet the written description and enablement requirements of the USPTO (35 U.S.C. § 112, first paragraph) or the EPO (Article 83 of the EPC), such that Applicants reserve the right and hereby disclose a disclaimer of any previously described product, process of making the product, or method of using the product. It may be advantageous in the practice of the invention to be in compliance with Art. 53(c) EPC and Rule 28(b) and (c) EPC. All rights to explicitly disclaim any embodiments that are the subject of any granted patent(s) of applicant in the lineage of this application or in any other lineage or in any prior filed application of any third party is explicitly reserved. Nothing herein is to be construed as a promise.

BRIEF DESCRIPTION OF THE DRAWINGS

In the accompanying figures, like elements are identified by like reference numerals among the several preferred embodiments of the present invention.

DETAILED DESCRIPTION OF THE INVENTION

The foregoing and other features and advantages of the invention are apparent from the following detailed description of exemplary embodiments, read in conjunction with the accompanying drawings. The detailed description and drawings are merely illustrative of the invention rather than limiting, the scope of the invention being defined by the appended claims and equivalents thereof.

Embodiments of the invention will now be described with reference to the Figures, wherein like numerals reflect like elements throughout. The terminology used in the description presented herein is not intended to be interpreted in any limited or restrictive way, simply because it is being utilized in conjunction with detailed description of certain specific embodiments of the invention. Furthermore, embodiments of the invention may include several novel features, no single one of which is solely responsible for its desirable attributes or which is essential to practicing the invention described herein.

The use of the terms "a" and "an" and "the" and similar referents in the context of describing the invention are to be construed to cover both the singular and the plural, unless otherwise indicated herein or clearly contradicted by context. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Recitation of ranges of values herein are merely intended to serve as a shorthand method of referring individually to each separate value falling within the range, unless otherwise indicated herein, and each separate value is incorporated into the specification as if it were individually recited herein. The word "about," when accompanying a numerical value, is to be construed as indicating a deviation of up to and inclusive of 10% from the stated numerical value. The use of any and all examples, or exemplary language ("e.g." or "such as") provided herein, is intended merely to better illuminate the invention and does not pose a limitation on the scope of the invention unless otherwise claimed. No language in the specification should be construed as indicating any nonclaimed element as essential to the practice of the invention.

References to "one embodiment," "an embodiment," "example embodiment," "various embodiments," etc., may indicate that the embodiment(s) of the invention so described may include a particular feature, structure, or characteristic, but not every embodiment necessarily includes the particular feature, structure, or characteristic.

Further, repeated use of the phrase "in one embodiment," or "in an exemplary embodiment," do not necessarily refer to the same embodiment, although they may.

As used herein the term "method" refers to manners, means, techniques and procedures for accomplishing a given task including, but not limited to, those manners, means, techniques and procedures either known to, or readily developed from known manners, means, techniques and procedures by practitioners of the chemical, biochemical, electrical, and mechanical arts. Unless otherwise expressly stated, it is in no way intended that any method or aspect set forth herein be construed as requiring that its steps be performed in a specific order. Accordingly, where a method claim does not specifically state in the claims or descriptions that the steps are to be limited to a specific order, it is no way intended that an order be inferred, in any respect. This holds for any possible non-express basis for interpretation, including matters of logic with respect to arrangement of steps or operational flow, plain meaning derived from grammatical organization or punctuation, or the number or type of aspects described in the specification.

DESCRIPTION OF THE EMBODIMENTS

Generally speaking, the dispensing device with an electromechanical feedback system relates to the product of e-cigarettes, vape pen and similar products by adding an additional protection to prevent the product over-heat or blast in some extreme case. And more specifically, the dispensing device with an electromechanical feedback system detects the short circuit and disable power system to the atomizer to prevent the potential dangerous situation when short circuit is detected.

The dispensing device with an electromechanical feedback system is an analog and digital mixed circuit adding on the existing vape pen, the analog circuit is used to detect the short circuit and the digital circuit is used to remember the short/normal state of the product and control the power and report etc. The short threshold is set as about 1.26 ohm, and the threshold is adjustable by changing the value of the Rref (reference resistance). The possible uses of the invention can be any other short circuit detection and control according to the detection state of the product.

The dispensing device with an electromechanical feedback system is intended to provide safety features (especially short circuit protection) for the existing electrical cigarette devices by adding additional circuitry. The existing electrical cigarette devices may experience a circuit short due to reasons such as corrosion of the circuit caused by fluid leakage. This may cause dangerous overheating of the product or even failure of the internal battery without short circuit protection, which could result in user harm.

To mitigate these safety issues, the dispensing device with an electromechanical feedback system adds a novel feature that detects short circuits and disables the normal operation of the electrical cigarette device when a short circuit is detected. Detection of a short circuit is simultaneously signaled by flashing an LED and vibrating the device using a motor.

Figure 1:
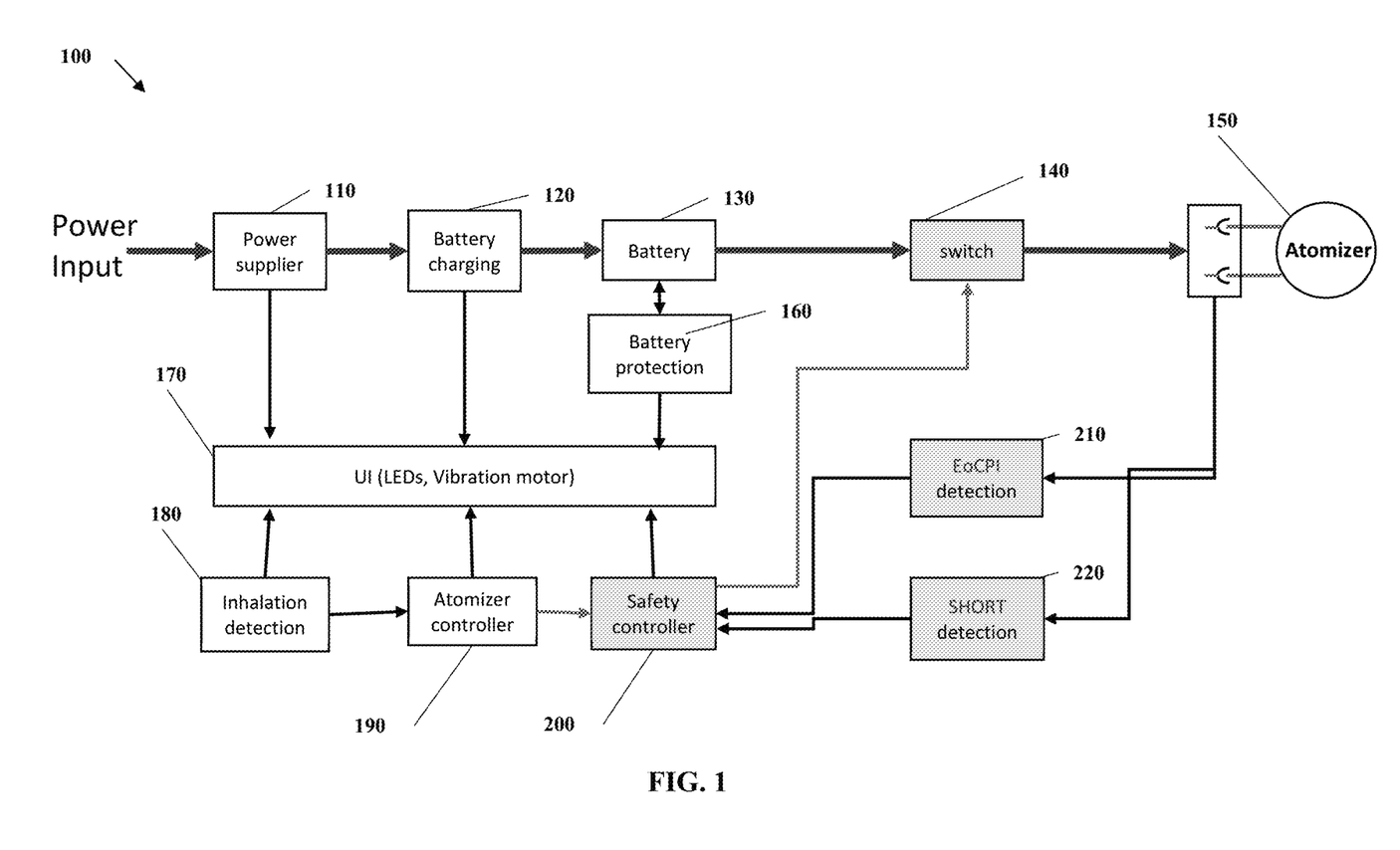
FIG. 1 is a schematic flow chart block of the dispensing device with an electromechanical feedback system.

As shown in FIG. 1, the dispensing device with an electromechanical feedback system 100 comprises a power supply 110, a battery charging device 120, a battery 130, a switch 140, an atomizer 150, a battery protection device 160, a electromechanical feedback UI 170, an inhalation detection device 180, an atomizer controller 190, a safety controller 200, an EoCPI detection device 210, and a short detection 220. The thicker arrows represent the flow of electrical power to the atomizer, while the thin arrows represent the general control signals, and the thinnest arrows represent the safety shutoff signals. EoCPI is an abbreviation for "Event of Cartridge Plugging-In", which is the detection of the insertion of a new cartridge into a previously empty vaporizer.

The Switch 140 comprises two electrically controlled switches with different current carrying abilities which allow controlling power delivery to separate circuits. In one embodiment, the two electrically controlled switches are two MOSFETs. A higher current switch is used to feed the power to the atomizer for normal usage. A lower current switch allows control of the power to the EoCPI and SHORT detectors which are also shown in the above figure. This lower current switch provides for longer battery life, since the EoCPI and SHORT detectors do not need to be powered continuously. The metal-oxide semiconductor field-effect transistor (MOSFET) is a type of field-effect transistor (FET), most commonly fabricated by the controlled oxidation of silicon. It has an insulated gate, the voltage of which determines the conductivity of the device. This ability to change conductivity with the amount of applied voltage can be used for amplifying or switching electronic signals.

The EoCPI detection 210 functions to detect if there is a cartridge attached or not. The short detection device 220 functions to detect if there is a short circuit or not. The safety controller decice 200 functions to organize the detection timing and remember the detection of a short circuit. If a short circuit is detected, the safety controller device 200 sends the Switch block a signal to disable the high current switch (this results in blocking any intentional puffing) and notify the user via an LED and vibration motor to indicate the potential danger.

Figure 2:
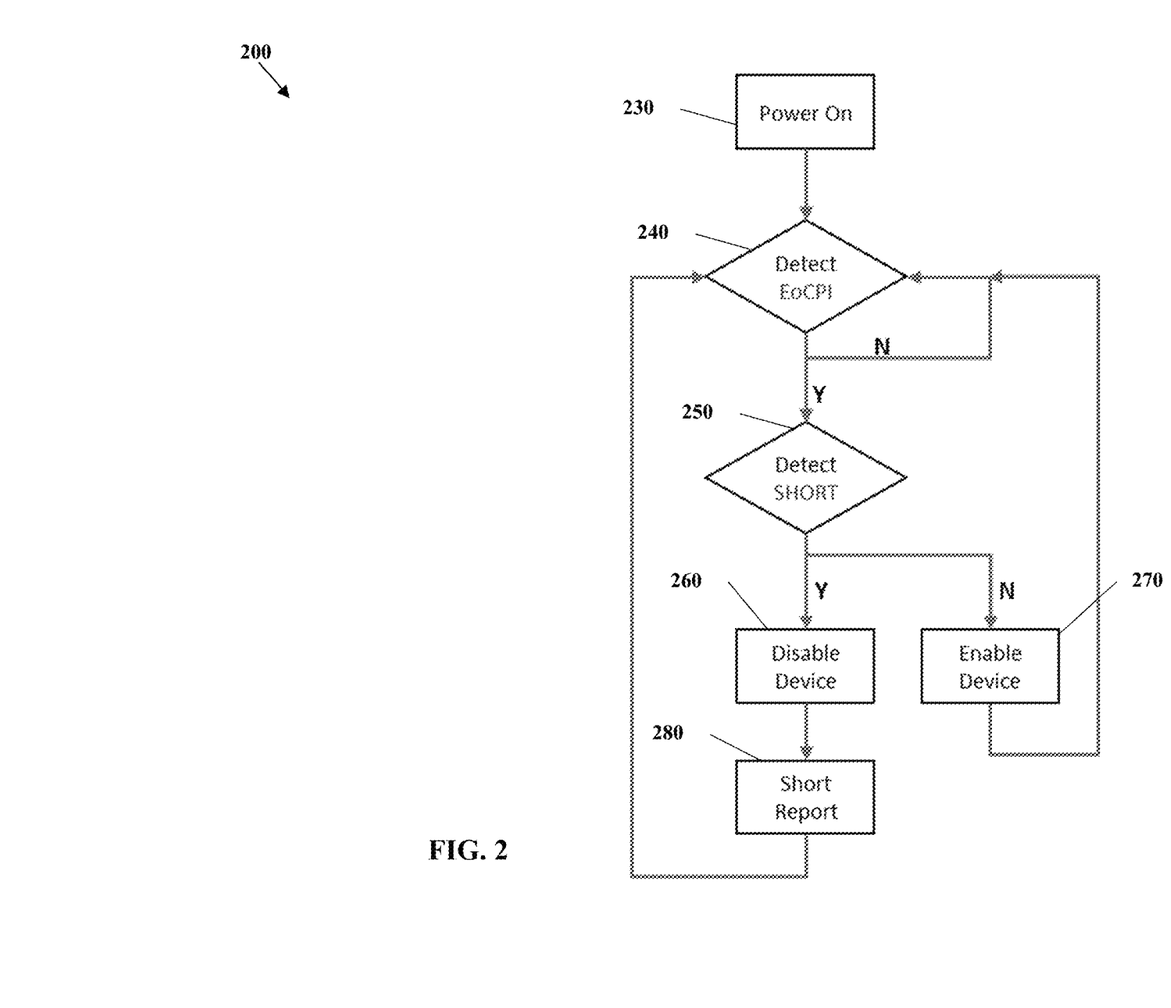
FIG. 2 is a flow chart showing the logic of the Safety Controller.

As shown in FIG. 2, the Safety Controller 200 comprises an application of power event 230, the safety controller waits until an EoCPI detection occurs 240 due to the insertion of a new vapor cartridge. Upon an EoCPI event, the safety controller tests for the existence of a short circuit 250. If a short circuit is detected, the device is disabled 260, and then an alarm is asserted through the LED and vibration motor. If no short circuit is detected, the device is ready for normal use 270, and the safety controller will wait for the next EoCPI event 230.

Figure 3:
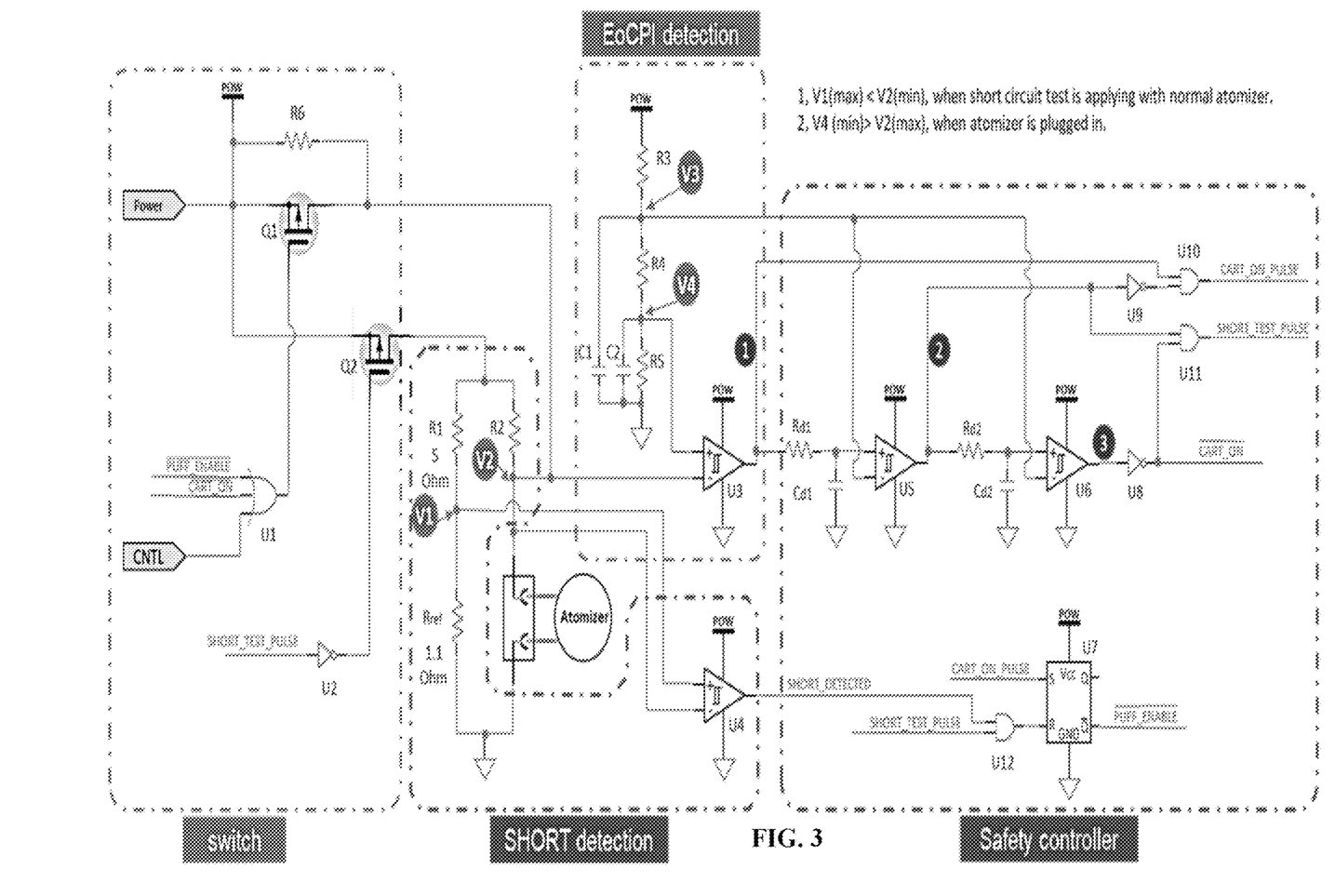
FIG. 3 is a Circuitry schematic of the switch block.

The circuit implementation diagram is shown in FIG. 3, and the circuit four function blocks which correspond to the switch, the EoCPI detection, safety controller, and the short detection device.

Circuitry of the Switch Block.

The switch function block in the example consists of two P-channel MOSFETs (Q1 and Q2) which act as the electrical switch elements, a NOT gate (U2) and an OR gate (U1). Q1 is the high-current switch element that controls power to the atomizer, while Q2 is the lower-current switch element that controls power to the EoCPI and SHORT detection circuitry.

Two external inputs are connected to the switch function block. The input port 'Power' represents the power from the battery, and the input port 'CNTL' is a control signal to turn on switch Q1 when puffing is detected by the inhalation detection device or a puffing detection sensor.

Three internal control signals from the safety controller are fed into the switch. SHORT_TEST_PULSE enables power to the EoCPI and SHORT detection circuitry, starting the short circuit detection when its level is high. PUFF_ENABLE and CART_ON_PULSE are control signals that cause the controller to turn on Q1 when they are low level at the same time.

Circuitry of the SHORT Detection Block.

The circuitry of the short detection block consists of a resistor bridge (R1, R2, Rref and the equivalent resistance of the atomizer) and a Schmitt comparator (U4).

In this example circuit, R1 and R2 are each 5 Ohms, and Rref is 1.1 Ohm (other values are allowed, but R1 and R2 should have equal resistance). When Q2 is on, if the equivalent resistance of the atomizer is less than Rref, then the voltage designated as V1 in FIG. 3 will be higher than V2. In this case, the output SHORT_DETECTED of U4 will be a high-level signal, indicating that a short circuit has been detected.

Rref provides a comparison value for determining if there is a short circuit and is chosen to have a slightly lower resistance than the total equivalent resistance of the Atomizer when the product is not short circuited, and a cartridge is inserted.

If the equivalent resistance of the atomizer is less than Rref, that indicates that the circuit is shorted, and the SHORT_DETECTED signal will be a high level.

Circuitry of the EoCPI Detection Block

The circuitry of the EoCPI detection block includes of a voltage divider (R3, R4, R5, C1, and C2) and a Schmitt comparator (U3). The voltage divider provides reference voltages designated as V3 and V4 in FIG. 3 that depend on the values chosen for resistors R3, R4, and R5:

1. V3=(R4+R5)/(R3+R4+R5) (select resistor values to make V3 approximately 70% of incoming Power voltage);
2. V4=(R5)/(R3+R4+R5).

When there is no cartridge attached, the negative input of U3 (V2) is high-level (close to the voltage of the incoming Power) due to conduction through R6. In this case, the output of comparator U3 (shown as ❶ in FIG. 3) is a low level. When there is a cartridge, V2 is low-level (close to 0, since the equivalent resistance of the Atomizer is around 2 to 3 Ohms), so the output of U3 will be high-level.

From the above analysis, the output of U3 (❶ in FIG. 3) is high-level when the cartridge is attached and output low-level without a cartridge. So, if a cartridge is plugged in, the output of U3 will change from low-level to high-level. If the cartridge's present state does not change, there will be no change in U3's output. In other words, the rising edge indicates the event of cartridge plugging in (EoCPI).

Circuitry of the Safety Controller Block

The circuitry of the safety controller block is composed of a signal delay line, combinational logic and state memory.

The signal delay line includes a first delay stage (Rd1, Cd1, Schmitt comparator U5), a second delay stage (Rd2, Cd2, Schmitt comparator U6) and NOT gate U8. The time constants of the two RC networks (Rd1/Cd1 and Rd2/Cd2) set the time delays of the first and second delay stages of the delay line. In this example, these time constants are each about 10 ms.

The combinational logic includes NOT gates (U8, U9) as well as AND gates (U10, U11). This logic produces the signals CART_ON_PULSE, SHORT_TEST_PULSE and CART_ON.

CART_ON_PULSE indicates an EoCPI event by outputting a high-level pulse of around 10 ms duration.

SHORT_TEST_PULSE is a 10 ms long high-level pulse that is used to turn on the lower-current electrical switch (the MOSFET Q2) to enable short circuit detection.

CART_ON is a state signal whose low-level indicates there is a cartridge inserted and whose high-level indicates there is no cartridge.

State memory is composed of a flip-flop register (U7) and its input combinational logic (AND gate U12). Its responsibility is to enable normal use of the device when no short circuit is detected.

The CART_ON_PULSE sets the flip-flop register first upon the EoCPI event, and the PUFF_ENABLE is output at a low-level state signal.

Immediately after the CART_ON_PULSE, the product will perform the short circuit test (SHORT_TEST_PULSE will output a high-level pulse).

If there is no short circuit detected, the output of U12 will continue to output a low-level, so the state of the flip-flop register will not change. As a result, PUFF_ENABLE will continue to output a low-level signal, thereby enabling normal device operation.

If there is a short circuit detected, U12 will output a high-level pulse, changing the state of the flip-flop register. As a result, PUFF_ENABLE signal will be high-level, thereby disabling normal device operation.

Timing and Control Logic

Figure 4:
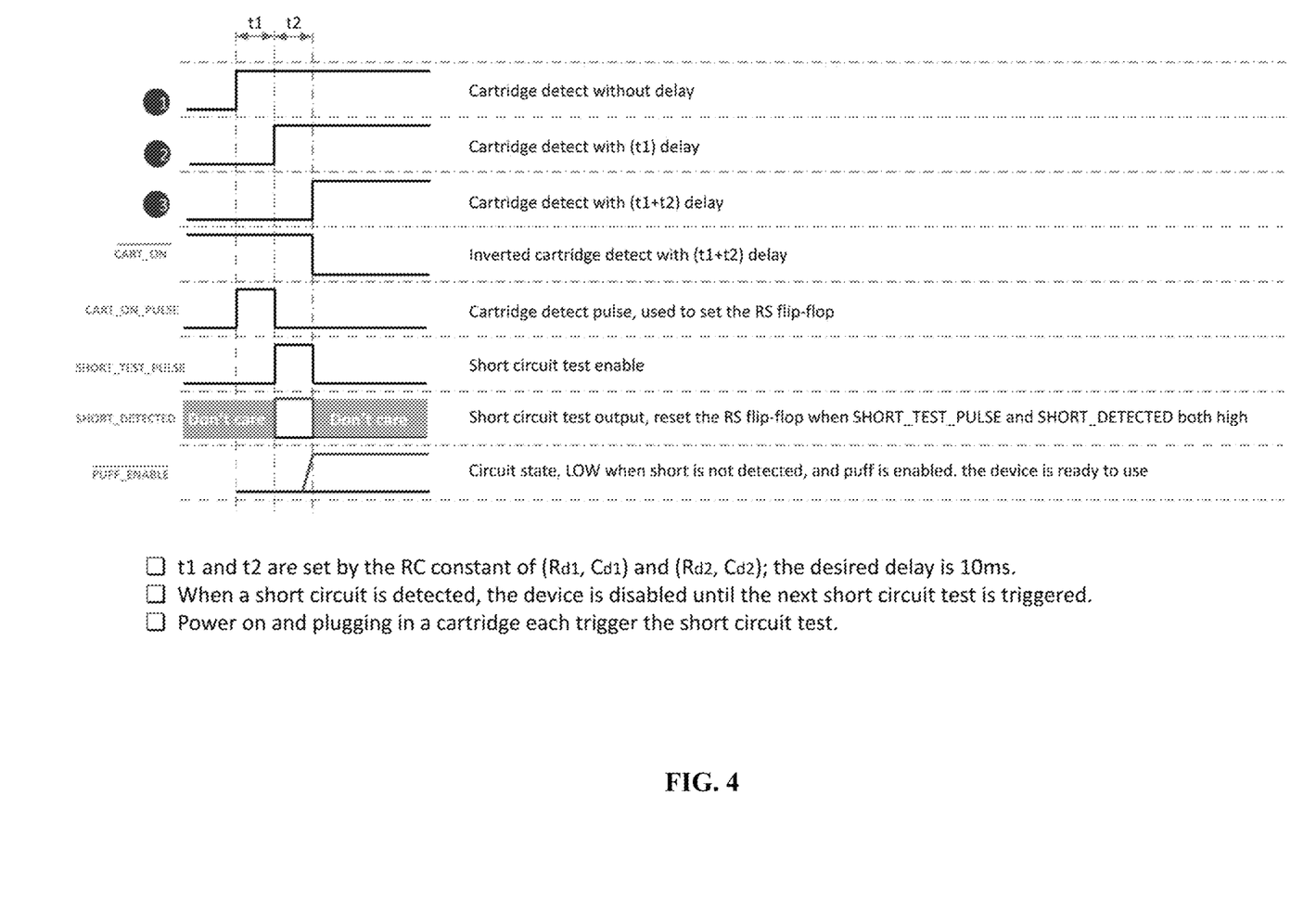
FIG. 4 is a schematic of the Signal timing and control logic.

FIG. 4 shows the signal timing and control logic. Signals ❷ and ❸ are delayed versions of signal ❶. The CART_ON signal is the inverse of signal ❸. CART_ON_PULSE is generated by logic of '❶ AND NOT ❷'. SHORT_TEST_PULSE is generated by logic of '❷ AND NOT ❸'.

The output of SHORT_DETECTED is only meaningful when SHORT_TEST_PULSE is high-level. PUFF_ENABLE is a memory state output which remembers the most recent short circuit test result and will not change until the next short circuit test is performed after the next EoCPI event.

Choice of Resistor and Capacitor Values

The values (and tolerances) of certain resistors and capacitors are critical for proper system performance. To correctly detect short circuits, several criteria should be considered for choosing the values and the tolerances of the sense-related resistors R1, R2, Rref, R3, R4, R5, and R6:

1. The maximum value of V1 should be less than the minimum value of V2 when a normal cartridge is attached during a short circuit test (Q2 is ON).
2. The minimum value of V4 should be larger than the maximum value of V2 when a normal cartridge is attached.
3. V3 should be around 70% of the supplied Power voltage for the delay line component selection calculation given below.

The values and tolerances used in the example circuit are listed in table 1. With these selections the prior criteria are met as shown.

TABLE 1 selected values and tolerance of sense-related resistors.
Assuming the voltage of input power is 1 V

|  | Value (Ohm) | Tolerance (%) | Min | Max |
| --- | --- | --- | --- | --- |
| R1 | 5 | 1 | 4.95 | 5.05 |
| R2 | 5 | 1 | 4.95 | 5.05 |
| Rref | 1.1 | 1 | 1.089 | 1.111 |
| Atomizer | 1.4 | 10 | 1.26 | 1.54 |
| R3 | 20000 | 1 | 19800 | 20200 |
| R4 | 30000 | 1 | 29700 | 30300 |
| R5 | 18000 | 1 | 17820 | 18180 |
| R6 | 20000 | 1 | 19800 | 20200 |

TABLE 1-continued selected values and tolerance of sense-related resistors.
Assuming the voltage of input power is 1 V

|    | Min         | Max         |
|----|-------------|-------------|
| V1 | 0.177390454 | 0.180327869 |
| V2 | 0.199683043 | 0.237288136 |
| V4 | 0.260831382 | 0.268617021 |
| V3 | 0.701712936 | 0.710017575 |
| V1(max) < V2(min) |  | TRUE |
| V4(min) > V2(max) |  | TRUE |

To make sure that each stage of the delay line delays the signal around 10 ms, the value of Rd1, Cd1, Rd2, and Cd2 should be selected carefully. The selection result and reasons are listed in Table 2.

TABLE 2 selection criteria for the resistors and capacitors in the delay line.

| Rd1, Cd1 | i.e. Rd1 = 47k Ohm, Cd1 = 0.18 uF |
| Rd2, Cd2 | i.e. Rd2 = 47k Ohm, Cd2 = 0.18 uF |

It will take 1.2 RC to reach 70% of the voltage of the power, so the RC constant should be 8.3 ms (10 ms/1.2).
So Rd1 *Cd1 = Rd2*Cd2 = 8.3 ms To avoid circuit short and its consequences, may use other materials with better corrosion resistance or reducing the corrosiveness of the vape juice. But this method can't guarantee the short circuit and its consequences. Using different materials with better corrosion resistance and less corrosiveness vape juice will potentially increase the cost.

The invention offers several advantages that set it apart from existing solutions. Some of the key features of the invention include: 1, cost effective: the cost of adding circuit is lower than changing to different materials. 2, safety enhancement, the invention can prevent any harm to the user caused by the short circuit.

Figure 5:
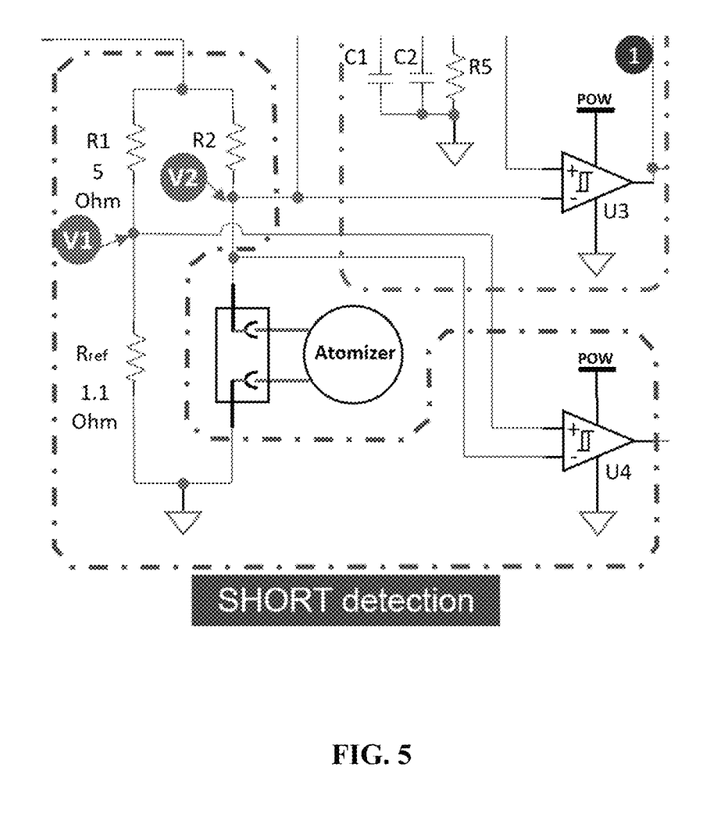
FIG. 5 is a schematic of the short detection circuit.

As shown in FIG. 5, the invention employs a short circuit detection method as a preventive measure against circuit shorts, instead of relying on advanced materials. This approach involves the addition of electrical circuits to the existing system, making it a simpler and more cost-effective solution compared to the implementation of new materials. Furthermore, even with the use of new materials, there remains a risk of potential short circuits and their associated consequences, including harm to the user. By utilizing short circuit detection and power control mechanisms, the invention ensures comprehensive prevention of any potential harm to the user.

To enable the implementation of short circuit detection and control, the invention consists of four interconnected sub-systems: the switch module, EoCPI detection, SHORT detection, and safety controller. Among these sub-systems, the SHORT detection plays a central role. It incorporates a resistance bridge and a comparator, which offer precise detection capabilities while requiring fewer and more cost-effective electrical components compared to alternatives such as an ADC (Analog-to-Digital Converter) and MCU (Microcontroller Unit).

By carefully selecting an appropriate up-arm resistor of the resistance bridge, typically around 5 ohms, the SHORT detection effectively limits the current to a safe range during the detection process. This design choice ensures that the circuit operates within secure parameters and minimizes the risk of potential harm.

Figure 6:
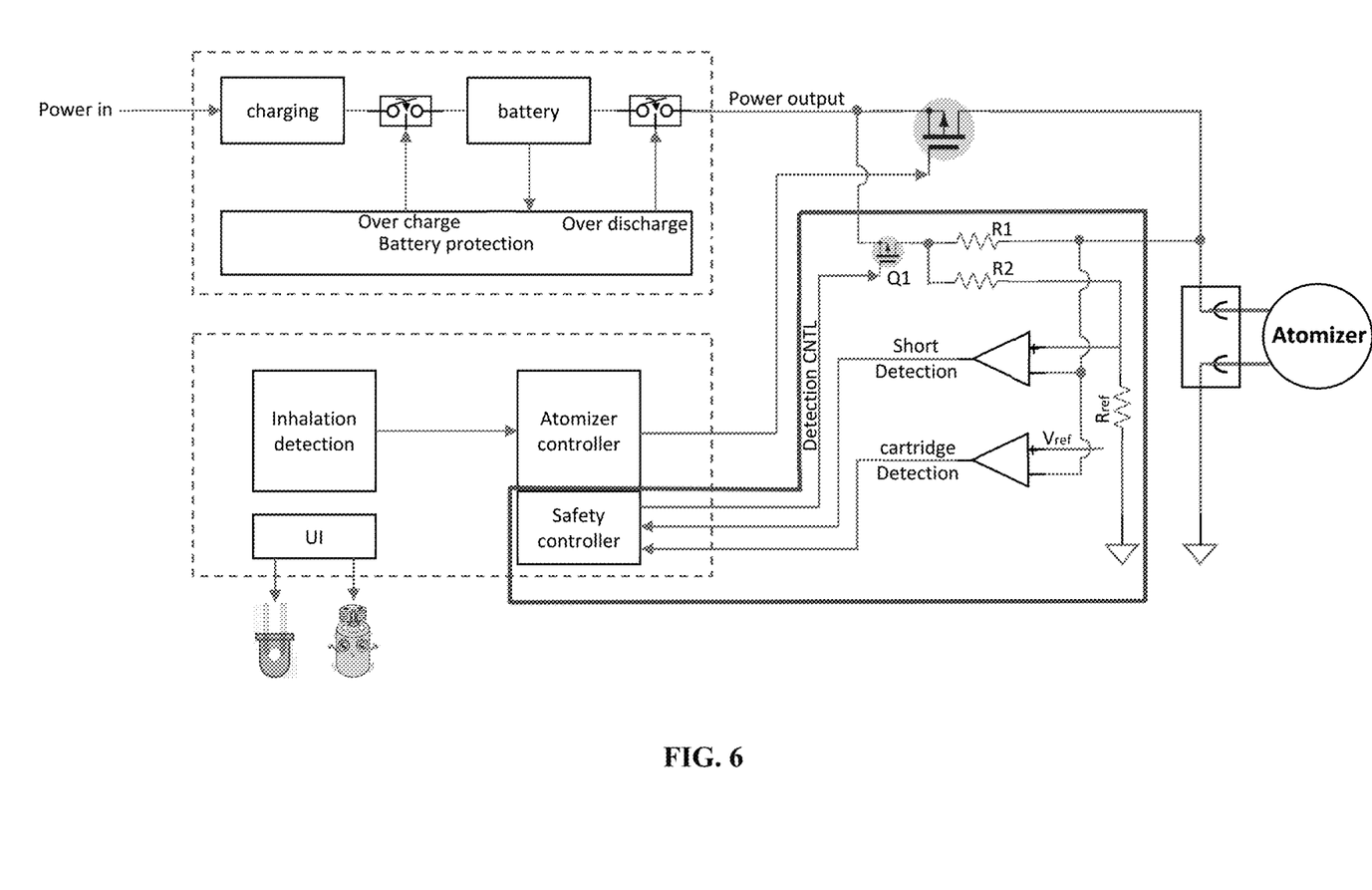
FIG. 6 is a schematic of an alternative embodiment.
Figure 7:
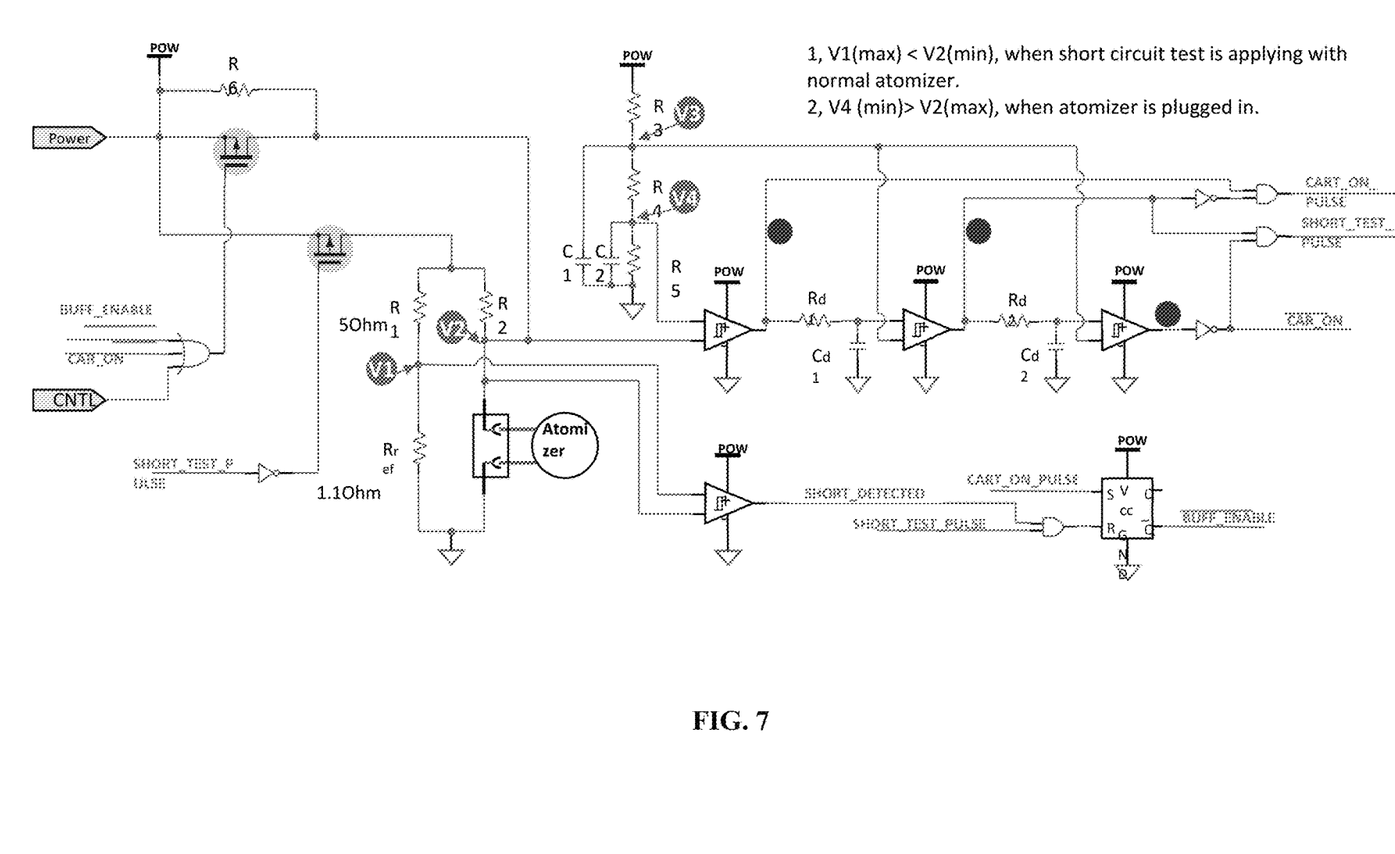
FIG. 7 is a Circuitry schematic of the switch block, in another embodiment.
Figure 8:
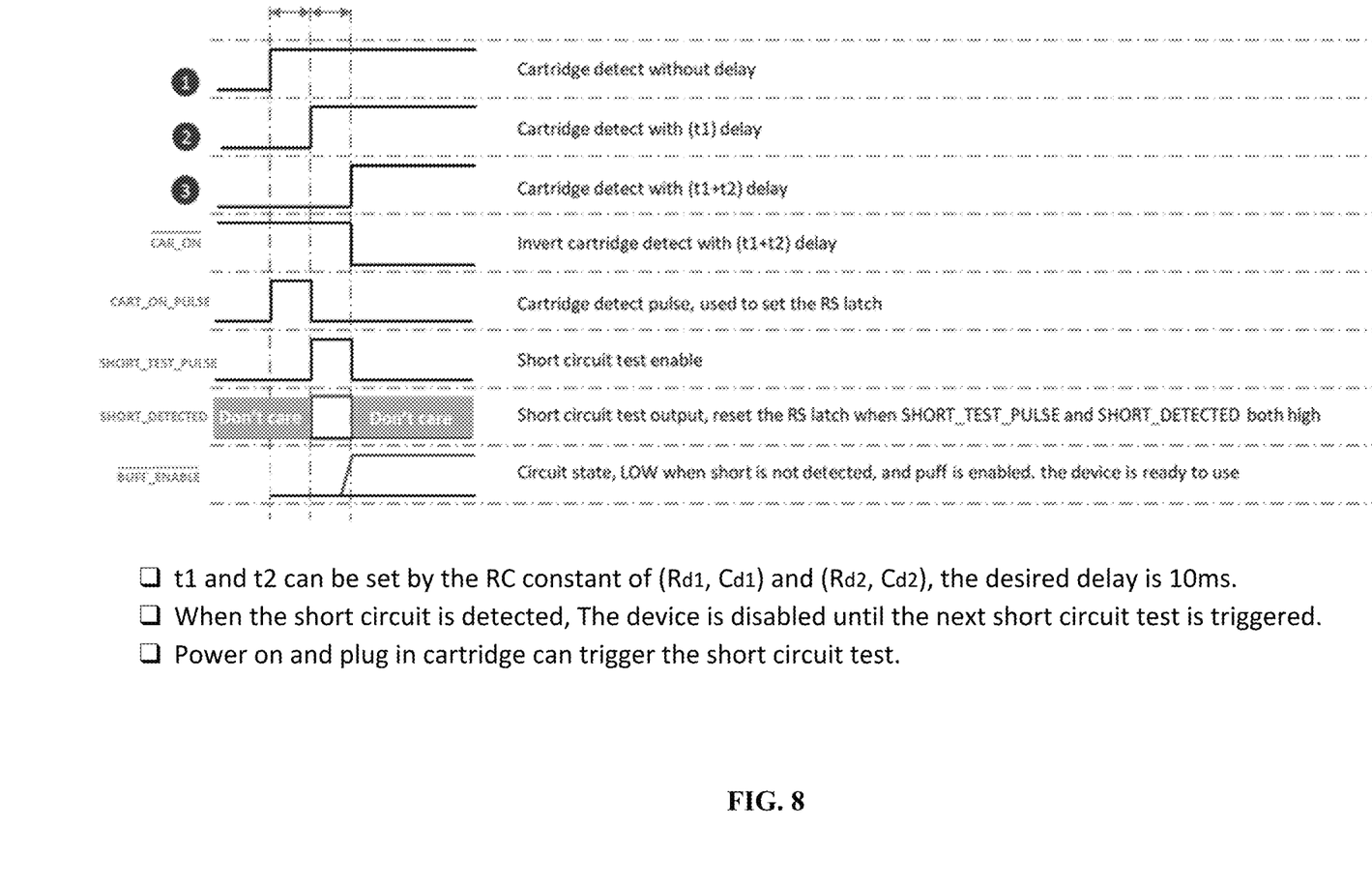
FIG. 8 is a schematic of the Signal timing and control logic, in another embodiment.

There are some other ways to enable the implementation of the short circuit detection and safety control. Some consideration of architecture can be find in the following attached files. As an alternative, it can use MCU and its peripherals to perform the same function. Alternative voltage-based detection methods are shown in FIGS. 6-8.

TABLE 3

| Condition | Short Detection | Cartridge Detection |
|-----------|-----------------|---------------------|
| No cartridge attached | LOW | LOW |
| Good cartridge attached | LOW | HIGH |
| Short cartridge attached | HIGH | HIGH |
| Internal connector part short | HIGH | HIGH |

All publications and patent applications mentioned in this specification are herein incorporated by reference to the same extent as if each individual publication or patent application was specifically and individually indicated to be incorporated by reference.

While the invention has been described in connection with various embodiments, it will be understood that the invention is capable of further modifications. This application is intended to cover any variations, uses or adaptations of the invention following, in general, the principles of the invention, and including such departures from the present disclosure as, within the known and customary practice within the art to which the invention pertains.

What is claimed is:

1. A dispensing device with an electromechanical feedback system, comprising a battery operably coupled to a switch and a battery protection device, an electromechanical feedback UI operably coupled to the battery protection device, an inhalation detection device, an atomizer controller, a safety controller, an Event of Cartridge Plugging-In (EoCPI) detection device operably coupled to the safety controller and an atomizer, and a short detection device operably coupled to the safety controller and the atomizer, wherein the flow of electrical power is transmitted to the atomizer and the safety controller sends a safety shut off signal to the switch;

the EoCPI detection device detects the insertion of a cartridge into the dispensing device, and the short detection device detects if there is a short circuit;

the switch comprises two electrically controlled switches with a higher current switch and a lower current switch carrying abilities which allow controlling power delivery to separate circuits;

the higher current switch feeds the power to the atomizer for normal usage, and the lower current switch controls the power to the EoCPI and short detection device, wherein the lower current switch extends the battery life, and the EoCPI detection device and the short detection device do not need to be powered continuously.

2. The dispensing device of claim 1, wherein the higher current switch and the lower current switch are MOSFETs (metal-oxide semiconductor field-effect transistors).

3. The dispensing device of claim 2, wherein the safety controller waits until an EoCPI detection event occurs due to the insertion of the cartridge; and upon an EoCPI detection event, the safety controller tests for the existence of the short circuit; if a short circuit is detected by the safety controller, the dispensing device is disabled and then an alarm is asserted through the electromechanical feedback UI; if no short circuit is detected by the safety controller, the dispensing device is ready for normal use.

4. The dispensing device of claim 3, wherein the electromechanical feedback UI includes an LED light and a vibration motor.

5. The dispensing device of claim 4, wherein the switch comprises a first P-channel MOSFET and a second P-channel MOSFET, a NOT gate, and an OR gate; the first P-channel MOSFET is the higher current switch that controls power to the atomizer, and the second P-channel MOSFET is the lower current switch that controls power to the EoCPI and SHORT detection circuitry.

6. The dispensing device of claim 5, wherein the switch includes a first external input and a second external input, the first external input is a power port from the battery, and the second external input is a control signal used to turn the first P-channel MOSFET on when puffing is detected by the inhalation detection device.

7. The dispensing device of claim 6, wherein a circuitry of the safety controller includes a first internal control signal, a second internal control signal, and a third internal control signal, the first internal control signal, the second internal control signal, and the third internal control signal are fed into the switch; and the first internal control signal is a SHORT_TEST_PULSE signal enabling power to the EoCPI and SHORT detection circuitry, starting the short circuit detection when its level is high; the second control signal is a PUFF_ENABLE signal and the third control signal is a CART_ON_PULSE signal, the PUFF_ENABLE signal and the CART_ON_PULSE signal are control signals that cause the controller to turn on first P-channel MOSFET when the PUFF_ENABLE signal and the CART_ON_PULSE signal are at low levels at the same time.

8. The dispensing device of claim 7, wherein a circuitry of the short detection device includes a resistor bridge and a Schmitt comparator (U4); wherein the resistor bridge includes R1, R2, Rref, and an equivalent resistance of the atomizer), R1 and R2 include an equal resistance, and Rref is 1.1 Ohm; when the second P-channel MOSFET is on, if the equivalent resistance of the atomizer is less than Rref, then the voltage designated as V1 be higher than V2, and the output SHORT_DETECTED of U4 is a high-level signal, indicating that a short circuit has been detected.

9. The dispensing device of claim 8, wherein Rref provides a comparison value for determining if there is a short circuit and has a lower resistance than the total equivalent resistance of the atomizer when the dispensing device is not short circuited, and a cartridge is inserted.

10. The dispensing device of claim 9, wherein if the equivalent resistance of the atomizer is less than Rref, that indicates that the circuit is shorted, and the SHORT_DETECTED signal is a high level.

11. The dispensing device of claim 10, wherein a circuitry of the EoCPI detection device includes a voltage divider and a Schmitt comparator (U3); the voltage divider includes R3, R4, R5, C1, and C2; the voltage divider provides reference voltages designated as V3 and V4 that depend on the values chosen for resistors R3, R4, and R5; V3=(R4+R5)/(R3+R4+R5); and V4=(R5)/(R3+R4+R5).

12. The dispensing device of claim 11, when there is no cartridge attached, the negative input of U3 (V2) is a high-level close to the voltage of the incoming power due to conduction through R6; an output of comparator U3 is a low level; and when there is a cartridge, V2 is a low-level close to 0, and the equivalent resistance of the atomizer is around 2 to 3 Ohms), and the output of U3 is a high-level.

13. The dispensing device of claim 12, when the output of U3 is high-level when the cartridge is attached and output low-level without a cartridge; if a cartridge is plugged in, the output of U3 changes from low-level to high-level; and if the cartridge's presence state does not change, and there is no change in an output of U3.

14. The dispensing device of claim 13, wherein the circuitry of the safety controller comprises a signal delay line, a combinational logic, and a state memory; wherein the signal delay line includes a first delay stage, a second delay stage; the first delay stage includes Rd1, Cd1, Schmitt comparator U5, the second delay stage includes Rd2, Cd2, Schmitt comparator U6 and a NOT gate U8; a plurality of time constants of the two RC networks (Rd1/Cd1 and Rd2/Cd2) set the time delays of the first and second delay stages of the delay line.

15. The dispensing device of claim 14, wherein the combinational logic includes NOT gates (U8, U9) and AND gates (U10, U11), wherein the combinational logic produces the signals CART_ON_PULSE, SHORT_TEST_PULSE and CART_ON.

16. The dispensing device of claim 15, wherein the CART_ON_PULSE indicates an EoCPI event by outputting a high-level pulse of around 10 ms duration.

17. The dispensing device of claim 16, wherein the SHORT_TEST_PULSE is a 10 ms long high-level pulse that is used to turn on the lower-current electrical switch to enable a short circuit detection.

18. The dispensing device of claim 17, wherein the CART_ON is a state signal whose low-level indicates there is a cartridge inserted and whose high-level indicates there is no cartridge inserted.

19. The dispensing device of claim 18, wherein the state memory comprises a flip-flop register (U7) and an input combinational logic (AND gate U12); and the input combinational logic enables the normal use of the dispensing device when no short circuit is detected.

20. The dispensing device of claim 19, wherein the CART_ON_PULSE sets the flip-flop register first upon the EoCPI event, and the PUFF_ENABLE outputs a low-level state signal; after the CART_ON_PULSE, the dispensing device performs the short circuit test including the SHORT_TEST_PULSE outputting a high-level pulse; if there is no short circuit detected, the output of U12 continues to output a low-level, so the state of the flip-flop register does not change; the PUFF_ENABLE signal continues to output a low-level signal, thereby enabling normal dispensing device operation; and if there is a short circuit detected, U12 outputs a high-level pulse, changing the state of the flip-flop register; and the PUFF_ENABLE signal is high-level, thereby disabling normal dispensing device operation.

* * * * *